US010151818B2

(12) United States Patent
An et al.

(10) Patent No.: US 10,151,818 B2
(45) Date of Patent: Dec. 11, 2018

(54) MAGNETIC RESONANCE ANGIOGRAPHY METHOD AND APPARATUS

(71) Applicant: Siemens Aktiengesellschaft, Munich (DE)

(72) Inventors: Jing An, Beijing (CN); De He Weng, Shenzhen (CN)

(73) Assignee: Siemens Aktiengesellschaft, Munich (DE)

(\*) Notice: Subject to any disclaimer, the term of this patent is extended or adjusted under 35 U.S.C. 154(b) by 468 days.

(21) Appl. No.: 14/815,073

(22) Filed: Jul. 31, 2015

(65) Prior Publication Data

US 2016/0033608 A1 Feb. 4, 2016

(30) Foreign Application Priority Data

Jul. 31, 2014 (CN) .......................... 2014 1 0371090

(51) Int. Cl.
*G01R 33/563* (2006.01)
*G01R 33/48* (2006.01)

(52) U.S. Cl.
CPC ................................ *G01R 33/5635* (2013.01)

(58) Field of Classification Search
CPC ....................................... G01R 33/56–33/5676
See application file for complete search history.

(56) References Cited

U.S. PATENT DOCUMENTS

| 2003/0122545 | A1* | 7/2003 | Van Den Brink ..... G01R 33/5611 324/309 |
| 2008/0081986 | A1* | 4/2008 | Slavin ..................... A61B 5/055 600/410 |
| 2008/0169809 | A1* | 7/2008 | Petersson ........... G01R 33/4828 324/309 |
| 2008/0205735 | A1* | 8/2008 | Nielles-Vallespin ..... A61B 5/02007 382/131 |
| 2009/0088626 | A1* | 4/2009 | Sutton ................ G01R 33/4806 600/419 |
| 2011/0140697 | A1* | 6/2011 | Shinoda ........... G01R 33/56509 324/309 |
| 2012/0271158 | A1  | 10/2012 | Schmitt |
| 2013/0009640 | A1* | 1/2013 | Fautz ................. G01R 33/5605 324/309 |
| 2014/0070803 | A1* | 3/2014 | Jin ..................... G01R 33/5605 324/309 |

\* cited by examiner

*Primary Examiner* — Huy Q Phan
*Assistant Examiner* — David Frederiksen
(74) *Attorney, Agent, or Firm* — Schiff Hardin LLP

(57) ABSTRACT

In a magnetic resonance angiography method and apparatus, a time-of-flight sequence is used to acquire and enter k-space data, and a magnetic resonance angiography image is reconstructed from the k-space data. The time-of-flight sequence includes at least one saturation radio frequency pulse and multiple excitation radio frequency pulses. At least two of the excitation radio frequency pulses directly follow the saturation radio frequency pulse, and part of the k-space data is collected after each of the excitation pulses. Scanning time can thus be decreased, scanning efficiency can be improved, the electromagnetic absorption ratio can be reduced, and a venous magnetic resonance signal is still suppressed.

6 Claims, 5 Drawing Sheets

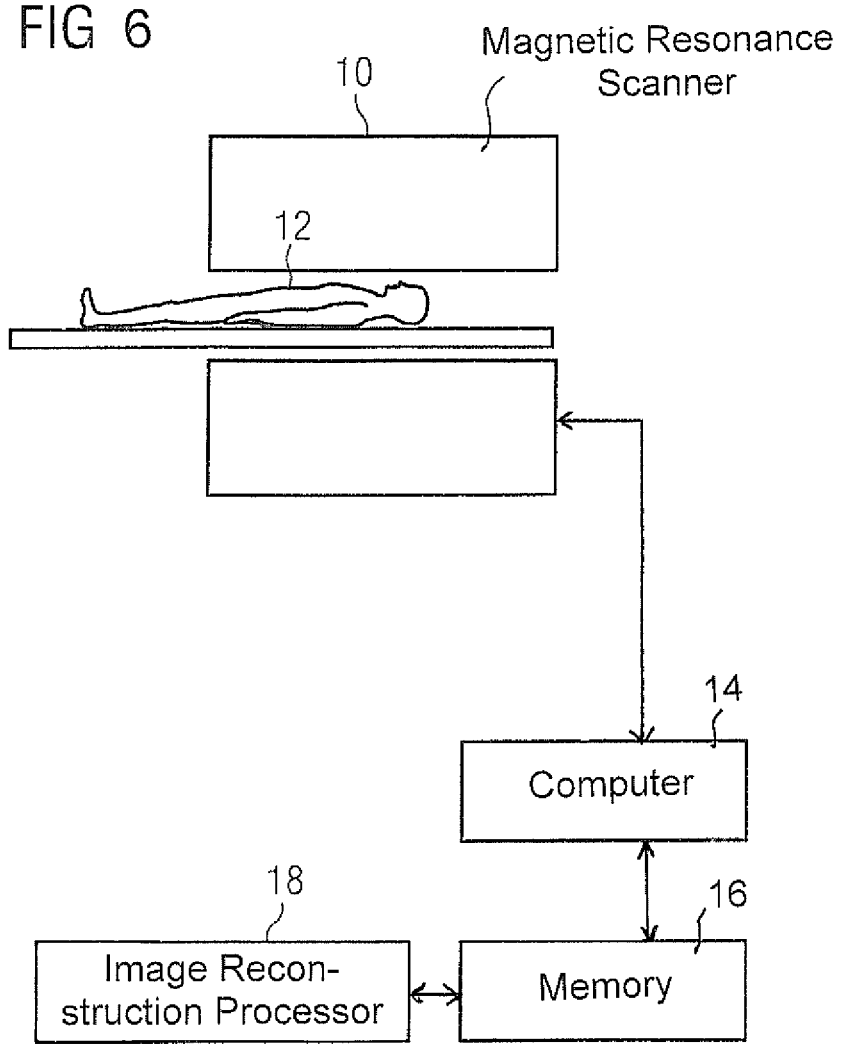

MAGNETIC RESONANCE ANGIOGRAPHY METHOD AND APPARATUS

BACKGROUND OF THE INVENTION

Field of the Invention

The present invention relates to the technical field of magnetic resonance imaging, and particularly to a magnetic resonance angiography method and apparatus.

Description of the Prior Art

Magnetic resonance imaging (MRI) is an imaging modality using magnetic resonance phenomenon. The principle of magnetic resonance is that the protons of atomic nuclei containing an odd number of protons, such as the nuclei of hydrogen atoms that are widely present in the human body, have spin motion like small magnets, and the spin axes of these small magnets normally have no definite orientation. When an external magnetic field is applied, these small magnets are rearranged according to the lines of magnetic force of the external magnetic field, particularly in the two directions respectively parallel to or anti-parallel to the lines of magnetic force of the external magnetic field. The above-mentioned direction parallel to the line of magnetic force of the external magnetic field is termed as a positive longitudinal axis while the above-mentioned direction anti-parallel to the line of magnetic force of the external magnetic field is termed as a negative longitudinal axis. The atomic nuclei have only longitudinal magnetized vectors, in which the longitudinal magnetized vectors have both direction and amplitude. The atomic nuclei in an external magnetic field are subjected to a pulse excitation using a radio frequency (RF) pulse of a specific frequency, so as to enable the spin axes of these atomic nuclei to deviate from the positive longitudinal axis or the negative longitudinal axis to produce resonance, which is the magnetic resonance phenomenon. The atomic nuclei have transverse magnetized vectors after the spin axes of the above excited atomic nuclei deviate from the positive longitudinal axis or the negative longitudinal axis.

The absorbed energy is gradually released in the form of electromagnetic waves as the excited atomic nuclei emit echo signals after the radio frequency pulse emission stops, then both the phase and energy level of the excited atomic nuclei recover to the states prior to excitation, and an image can be reconstructed after further processing, e.g. spatially encoding the echo signals emitted from the atomic nuclei.

Conventionally, a time-of-flight (TOF) sequence is used in magnetic resonance angiography (MRA) imaging methods. FIG. 1 shows a schematic diagram of a time-of-flight sequence in the prior art. As shown in FIG. 1, the time-of-flight sequence comprises multiple saturation radio frequency pulses SaRFPs and multiple excitation radio frequency pulses ExRFPs, in which one saturation radio frequency pulse SaRFP is followed by one excitation radio frequency pulse ExRFP; the power of the saturation radio frequency pulse SaRFP is much higher than that of the excitation radio frequency pulse ExRFP, furthermore, the duration of the saturation radio frequency pulse SaRFP is much longer than that of the excitation radio frequency pulse ExRFP.

The time-of-flight sequence, before each excitation radio frequency pulse, using saturation radio frequency pulse plus spoiled gradient, saturates all of the spin signals which are parallel to the angiographic plane and located at the region on the side of the distal end, including the venous blood signals within this region. This method can well inhibit the venous blood signals flowing into the angiographic plane during the imaging process. However, the time-of-flight sequence has two disadvantages, one is low imaging efficiency and high time consumption; and the other is high SAR (electromagnetic absorption ratio) caused by intensive circulation of saturation radio frequency pulses SaRFPs.

A magnetic resonance angiography method is comprehensively described in the published patent application no. CN 102749603 A, assigned to Siemens Ltd.

SUMMARY OF THE INVENTION

The present invention provides a magnetic resonance angiography method, that includes the steps of scanning a time-of-flight sequence and collecting k-space data; and reconstructing a magnetic resonance angiography image using the k-space data, wherein the time-of-flight sequence includes at least one saturation radio frequency pulse and multiple excitation radio frequency pulses; at least two of the excitation radio frequency pulses directly follow the saturation radio frequency pulse, and part of the k-space data is collected after each of the excitation pulses.

Preferably, the number of the excitation radio frequency pulses is adjustable.

Preferably, the k-space location corresponding to the part of the k-space data is adjustable.

Preferably, the part of the k-space data collected after the excitation radio frequency pulse far away from the saturation radio frequency pulse is filled in a center region of k-space, and the part of the k-space data collected after the excitation radio frequency pulse close to the saturation radio frequency pulse is filled in an edge region of k-space.

Preferably, the part of the k-space data collected after the excitation radio frequency pulse far away from the saturation radio frequency pulse is filled in an edge region of k-space, and the part of the k-space data collected after the excitation radio frequency pulse close to the saturation radio frequency pulse is filled in a center region of k-space.

The present invention also provides a magnetic resonance angiography apparatus that has a scanning and collecting device (scanner) for scanning a time-of-flight sequence and collecting k-space data; and an image reconstruction computer for reconstructing a magnetic resonance angiography image using the k-space data, wherein the time-of-flight sequence includes at least one saturation radio frequency pulse and multiple excitation radio frequency pulses; at least two of the excitation radio frequency pulses follow the saturation radio frequency pulse, and part of the k-space data is collected after each of the excitation pulses.

Preferably, the k-space location corresponding to the part of the k-space data is adjustable.

The present invention also provides a magnetic resonance imaging system, that includes the magnetic resonance angiography apparatus described above.

Preferably, the intensity of the basic magnetic field of the magnetic resonance imaging system is higher than 1.5 Tesla.

Preferably, the intensity of the basic magnetic field of said magnetic resonance imaging system is 3 Tesla or 7 Tesla.

In summary, according to the magnetic resonance angiography method of embodiments of the present invention, the total number of the saturation radio frequency pulses used for the magnetic resonance angiography of one time-of-flight sequence can be reduced through "segmented" excitation radio frequency pulses in combination with the application of saturation radio frequency pulses, thus reducing scanning time, improving scanning efficiency, and reducing an electromagnetic absorption ratio, and meanwhile a venous magnetic resonance signal is still suppressed, accordingly.

BRIEF DESCRIPTION OF THE DRAWINGS

FIG. 6 is a block diagram of a magnetic resonance apparatus that is operable in order to implement the method according to the present invention.

DESCRIPTION OF THE PREFERRED EMBODIMENTS

Figure 1:
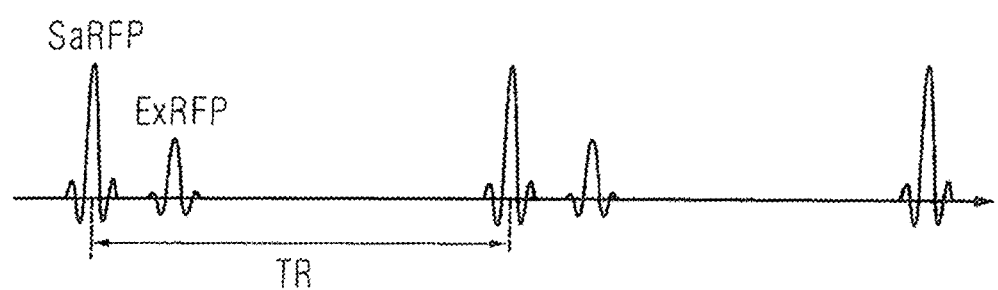
FIG. 1 is a schematic diagram for the pulses of a time-of-flight sequence according to the prior art.

In order to make the objects, technical solutions and advantages of the present invention more apparent, particular embodiments hereinafter are listed for further describing the present invention in detail.

With regard to the abovementioned two technical problems, there are two methods to improve the efficiency of a time-of-flight sequence: firstly, increase the amplitude of the saturation radio frequency pulse SaRFP and meanwhile shorten the duration of the saturated radio frequency pulse SaRFP, but this would increase the electromagnetic absorption ratio; secondly, close the saturated radio frequency pulse SaRFP, but this would lead to a failure in suppressing venous signals. Meanwhile, there are two methods to reduce the electromagnetic absorption ratio of a time-of-flight sequence: firstly, by means of reducing the amplitude of saturated radio frequency pulses SaRFP while increasing the duration of saturated radio frequency pulses SaRFP; secondly, using variable-rate selective excitation (VERSE) to selectively excite the saturation radio frequency pulses SaRFP instead of Sinc function shaped pulses, but both the methods described above may obviously increase the scanning time, in other words, reduce the efficiency of the time-of-flight sequence.

The core of the technical solution of the magnetic resonance angiography method according to the particular embodiments of the present invention consists in that a "segmented" concept is introduced to the application of the saturation radio frequency pulse SaRFP, in other words, one saturation radio frequency pulse SaRFP can be directly followed by several excitation radio frequency pulses ExRFPs (that is to say, several excitation radio frequency pulses ExRFPs are included between the rear of a former saturation radio frequency pulse SaRFP and the anterior of a latter saturation radio frequency pulse SaRFP in the same time-of-flight sequence or before the end of this time-of-flight sequence). The (segmented) number of the excitation radio frequency pulses ExRFPs following a saturation radio frequency pulse SaRFP can be varied and the maximum segmented number can be selected in the premise that the venous blood signals in the resulting magnetic resonance images are ensured to be saturated but not developed. The maximum segmented number can be selected according to the venous blood flow velocity of the person under examination, that is, the faster the velocity is, the smaller the segmented number is, and otherwise the segmented number is larger. Thus the scanning efficiency is improved and the electromagnetic absorption is reduced.

In order to improve the contrast between the arterial signals and the surrounding static tissue signals, multiple different filling procedures for entering the k-space data can be employed. For example, the part of the k-space data collected after the excitation radio frequency pulse far away from the saturation radio frequency pulse is filled in a center region of k-space, and the part of the k-space data collected after the excitation radio frequency pulse close to the saturation radio frequency pulse is filled in an edge region of k-space. Alternatively, the part of the k-space data collected after the excitation radio frequency pulse far away from the saturation radio frequency pulse is filled in a center region of k-space, and the part of the k-space data collected after the excitation radio frequency pulse close to the saturation radio frequency pulse is filled in an edge region of k-space.

For example, the location of part of the data in the k-space can be collected after adjusting the excitation radio frequency pulse ExRFP according to the segmented number and the arterial blood flow velocity of the person under examination, for instance, for a person under examination who has a relatively fast blood flow, the data closer to the center of the k-space can be collected at the rear of the excitation radio frequency pulse ExRFP which is farther away from the saturation radio frequency pulse SaRFP; thus the contrast between the arterial signals and the surrounding static tissue signals can be improved.

Figure 2:
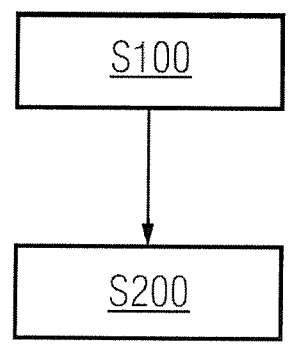
FIG. 2 is a schematic diagram for the steps of the magnetic resonance angiography method according to the particular embodiments of the present invention.
Figure 3:
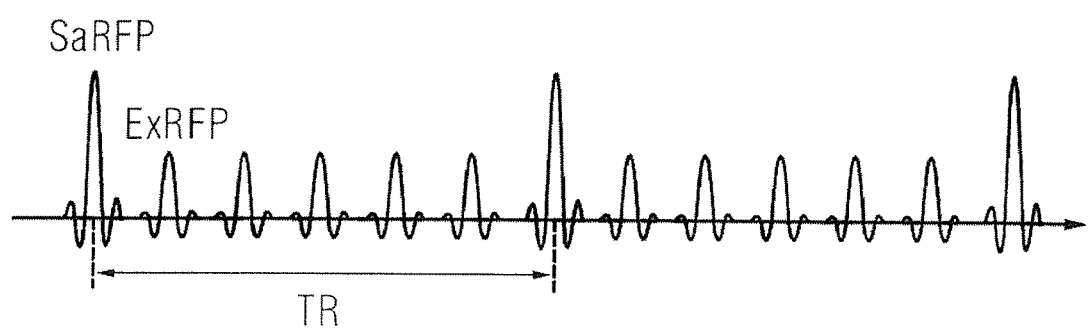
FIG. 3 is a schematic diagram for the pulses of the time-of-flight sequence according to the particular embodiments of the present invention.

FIG. 2 is a schematic diagram for the steps of the magnetic resonance angiography method according to the particular embodiments of the present invention. As shown in FIG. 2, the magnetic resonance angiography method according to the particular embodiments of the present invention comprises the following steps: S100, carrying out a time-of-flight sequence and collecting a part of k-space data; and S200, reconstructing a magnetic resonance angiography image using said k-space data, wherein the time-of-flight sequence includes multiple saturation radio frequency pulses and multiple excitation radio frequency pulse sequences; at least two excitation radio frequency pulses follow any one of the saturation radio frequency pulses.

In particular, the (segmented) number of the excitation radio frequency pulses ExRFPs following one saturation radio frequency pulse SaRFP is 5.

According to the magnetic resonance angiography method of particular embodiments of the present invention, the total number of the saturation radio frequency pulses used for magnetic resonance angiography of one time-of-flight sequence can be reduced through "segmented" excitation radio frequency pulses in combination with the application of saturation radio frequency pulses, thus reducing the scanning time, improving the scanning efficiency, and reducing the electromagnetic absorption ratio, and meanwhile the venous magnetic resonance signals are still suppressed, accordingly.

Figure 4:
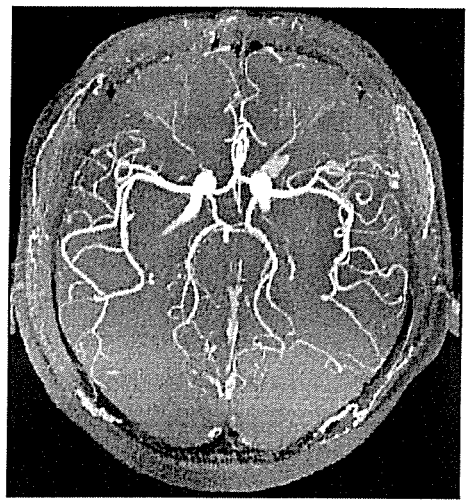
FIG. 4 is a brain vessel image obtained via scanning according to a time-of-flight sequence of the prior art.
Figure 5:
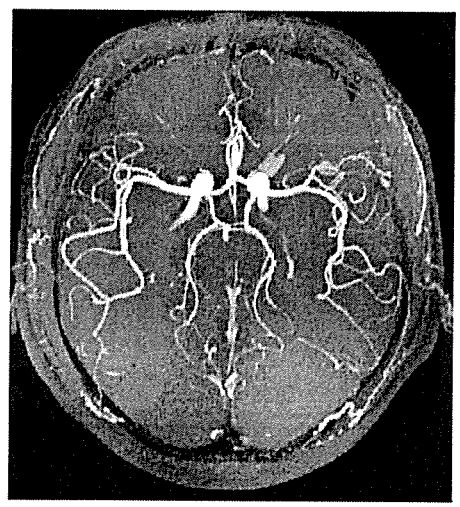
FIG. 5 is a brain vessel image obtained via scanning according to the time-of-flight sequence of the particular embodiments of the present invention.

FIG. 4 is a brain vessel image obtained via scanning according to a time-of-flight sequence of the prior art, and FIG. 5 is a brain vessel image obtained via scanning according to the time-of-flight sequence of the particular embodiments of the present invention. Although the scanning time of the time-of-flight sequence according to the particular embodiments of the present invention is less than that of a time-of-flight sequence according to the prior art by 18% and the venous signals are still suppressed effectively, as shown in FIGS. 4 and 5, there is no obvious difference between the brain vessel image obtained via scanning according to the time-of-flight sequence of the particular embodiments of the present invention and the brain vessel image obtained via scanning according to the time-of-flight sequence of the prior art.

The magnetic resonance angiography method according to the particular embodiments of the present invention is more useful for a magnetic resonance imaging system having the intensity of a basic magnetic field higher than 1.5 Tesla (T). In particular, for a magnetic resonance imaging system having the intensity of a basic magnetic field of 3 Tesla (T), the time TR among the saturation radio frequency pulses can be appropriately reduced on the premise that there is no excessively high electromagnetic absorption ratio, thus reducing the scanning time and improving the scanning efficiency; while for a magnetic resonance imaging system having the intensity of a basic magnetic field of 7 Tesla (T), the number of the excitation radio frequency pulses among the saturation radio frequency pulses can be appropriately increased on the premise that there is an excessively high electromagnetic absorption ratio, so as to prolong the time among the saturation radio frequency pulses, thus reducing the electromagnetic absorption ratio; and even so, the venous magnetic resonance signals can still be suppressed, so the quality of the image would not be lost.

As shown in FIG. 6, a magnetic resonance apparatus for implementing the method according to the invention has a magnetic resonance scanner 10 in which a patient 12 is received. The magnetic resonance scanner 10 is operated by a computer 14, which is in communication with a memory 16 that serves as the k-space memory, and the memory 16 is accessible by an image reconstruction processor 18 in order to reconstruct image data from the k-space data in the memory 16. The computer 14 enters the acquired raw data into the memory 16 as k-space data in accordance with the method according to the invention, as described above.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance angiography method, comprising:
    operating a magnetic resonance scanner to execute a time-of-flight sequence to acquire magnetic resonance data from a subject situated in the scanner by radiating at least one saturation radio frequency pulse and multiple excitation radio frequency pulses, with at least two of said excitation radio frequency pulses directly following said saturation review of frequency pulse, and entering said magnetic resonance data into a memory as k-space data after each of said excitation pulses;
    selectively adjusting respective locations in k-space in which respective parts of said k-space data are entered respectively after each of said excitation pulses, in order to enter a portion of said k-space data after said excitation review of frequency pulse, and far from said saturation radio frequency pulse, into a center region of k-space, and in order to enter a portion of said k-space data required after said excitation pulse and close to said saturation radio frequency pulse into an edge region of k-space; and,
    in a processor, accessing said k-space data in said memory and reconstructing a magnetic resonance angiography image therefrom, and making the magnetic resonance angiography image available in electronic form at an output of said processor, as a data file.

2. A magnetic resonance angiography method as claimed in claim 1 comprising selectively adjusting a number of said excitation radio frequency pulses.

3. A magnetic resonance angiography method comprising:
    operating a magnetic resonance scanner to execute a time-of-flight sequence to acquire magnetic resonance data from a subject situated in the scanner by radiating at least one saturation radio frequency pulse and multiple excitation radio frequency pulses, with at least two of said excitation radio frequency pulses directly following said saturation review of frequency pulse, and entering said magnetic resonance data into a memory as k-space data after each of said excitation pulses;
    selectively adjusting respective locations in k-space in which respective parts of said k-space data are entered respectively after each of said excitation pulses, in order to enter a portion of said k-space data acquired after said excitation radio frequency pulse, and far from said saturation radio frequency pulse, into an edge region of k-space, and in order to enter a portion of said k-space data acquired after said excitation radio frequency pulse, and close to said saturation radio frequency pulse, into a center region of k-space; and
    in a processor, accessing said k-space data in said memory and reconstructing a magnetic resonance angiography image therefrom, and making the magnetic resonance angiography image available in electronic form at an output of said processor, as a data file.

4. A magnetic resonance angiography apparatus, comprising:
    a magnetic resonance scanner;
    an electronic memory;
    a control computer configured to operate said magnetic resonance scanner to execute a time-of-flight sequence to acquire magnetic resonance data from a subject situated in the scanner by radiating at least one saturation radio frequency pulse and multiple excitation radio frequency pulses, with at least two of said excitation radio frequency pulses directly following said saturation review of frequency pulse, and entering said magnetic resonance data into said memory as k-space data after each of said excitation pulses;
    said control computer being configured to selectively adjust respective locations in k-space in which respective parts of said k-space data are entered respectively after each of said excitation pulses in order to enter a portion of said k-space data after said excitation review of frequency pulse, and far from said saturation radio frequency pulse, into a center region of k-space, and in order to enter a portion of said k-space data required after said excitation pulse and close to said saturation radio frequency pulse into an edge region of k-space; and
    a processor configured to access said k-space data in said memory and reconstruct a magnetic resonance angiography image therefrom, and to make the magnetic resonance angiography image available in electronic form at an output of said processor, as a data file.

5. A magnetic resonance angiography apparatus as claimed in claim 4 wherein said control computer is configured to selectively adjust a number of said excitation radio frequency pulses.

6. A magnetic resonance angiography apparatus comprising:

a magnetic resonance scanner;

an electronic memory;

a control computer configured to operate said magnetic resonance scanner to execute a time-of-flight sequence to acquire magnetic resonance data from a subject situated in the scanner by radiating at least one saturation radio frequency pulse and multiple excitation radio frequency pulses, with at least two of said excitation radio frequency pulses directly following said saturation review of frequency pulse, and entering said magnetic resonance data into said memory as k-space data after each of said excitation pulses;

said control computer being configured to selectively adjust respective locations in k-space in which respective parts of said k-space data are entered respectively after each of said excitation pulses in order to enter a portion of said k-space data acquired after said excitation radio frequency pulse, and far from said saturation radio frequency pulse, into an edge region of k-space, and in order to enter a portion of said k-space data acquired after said excitation radio frequency pulse, and close to said saturation radio frequency pulse, into a center region of k-space; and a processor configured to access said k-space data in said memory and reconstruct a magnetic resonance angiography image therefrom, and to make the magnetic resonance angiography image available in electronic form at an output of said processor, as a data file.

* * * * *